(12) United States Patent
Matsumoto et al.

(10) Patent No.: US 11,121,085 B2
(45) Date of Patent: Sep. 14, 2021

(54) TRENCH WALLS, CONDUCTIVE STRUCTURES HAVING DIFFERENT WIDTHS AND METHODS OF MAKING SAME

(71) Applicant: MICRON TECHNOLOGY, INC., Boise, ID (US)

(72) Inventors: Hirokazu Matsumoto, Tokyo (JP); Ryota Suzuki, Kanagawa (JP); Mitsuki Koda, Kanagawa (JP); Makoto Sato, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 16/580,450

(22) Filed: Sep. 24, 2019

(65) Prior Publication Data

US 2021/0090998 A1    Mar. 25, 2021

(51) Int. Cl.
| | |
|---|---|
| *H01L 23/522* | (2006.01) |
| *H01L 23/528* | (2006.01) |
| *H01L 23/532* | (2006.01) |
| *H01L 21/768* | (2006.01) |
| *H01L 23/538* | (2006.01) |
| *H01L 25/065* | (2006.01) |

(52) U.S. Cl.
CPC .... *H01L 23/5283* (2013.01); *H01L 21/76807* (2013.01); *H01L 21/76816* (2013.01); *H01L 21/76877* (2013.01); *H01L 23/53228* (2013.01); *H01L 23/53257* (2013.01); *H01L 23/5384* (2013.01); *H01L 23/5386* (2013.01); *H01L 25/0652* (2013.01); *H01L 2225/06517* (2013.01); *H01L 2225/06541* (2013.01)

(58) Field of Classification Search
CPC ............... H01L 23/5226; H01L 23/528; H01L 23/53204; H01L 23/5384; H01L 23/5386; H01L 24/41; H01L 24/44; H01L 24/47; H01L 24/49
See application file for complete search history.

(56) References Cited

U.S. PATENT DOCUMENTS 7,442,990 B2 * 10/2008 Eun ................. H01L 21/823412
257/328

* cited by examiner

*Primary Examiner* — Hoai V Pham
(74) *Attorney, Agent, or Firm* — Dorsey & Whitney LLP

(57) ABSTRACT

Embodiments of the disclosure are drawn to apparatuses and methods for trench walls including widened portions and/or conductive structures including constricted portions. The trench walls may include multiple widened portions spaced apart along a length of the trench wall in some examples. Similarly, in some examples, the conductive structures may include multiple constricted portions spaced apart along a length of the conductive structure. In some examples, the dimensions of the widened portions and/or the spacing between the widened portions may be based on properties of the trench wall.

19 Claims, 5 Drawing Sheets

TRENCH WALLS, CONDUCTIVE STRUCTURES HAVING DIFFERENT WIDTHS AND METHODS OF MAKING SAME

BACKGROUND

This disclosure relates generally to conductive structures (e.g., wires, wiring layers), and more specifically, to conductive structures in semiconductor devices. For example, conductive structures may be used in memory devices, including volatile memory, such as dynamic random access memory (DRAM). DRAM may be included in a high bandwidth memory (HBM). HBM may include a die (e.g., chip) stack with one or more core die and one or more interface (IF) die. Each core die may include one or more memory arrays made up of one or more memory cells. Memory cells and/or other structures in the core die and/or IF die may be coupled to one another by one or more conductive structures. For example, conductive structures may couple one or more memory cells to a voltage source.

DETAILED DESCRIPTION

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Conductive structures may be used in a variety of semiconductor devices, for example, controllers and memories. Some conductive structures may be used for coupling two or more components. For example, an operational amplifier may be coupled to a power source by a conductive structure (e.g., wire). In order to couple components, the conductive structures may extend a distance across the device in some applications. Typically, devices include a significant number of conductive structures extending various distances across the device. The conductive structures may be placed close together in the device to save space. However, as the space between the conductive structures decreases, the risk of the conductive structures inadvertently touching one another and causing a short increases. Long lengths of the conductive structures may also increase the risk of short circuits.

Figure 1:
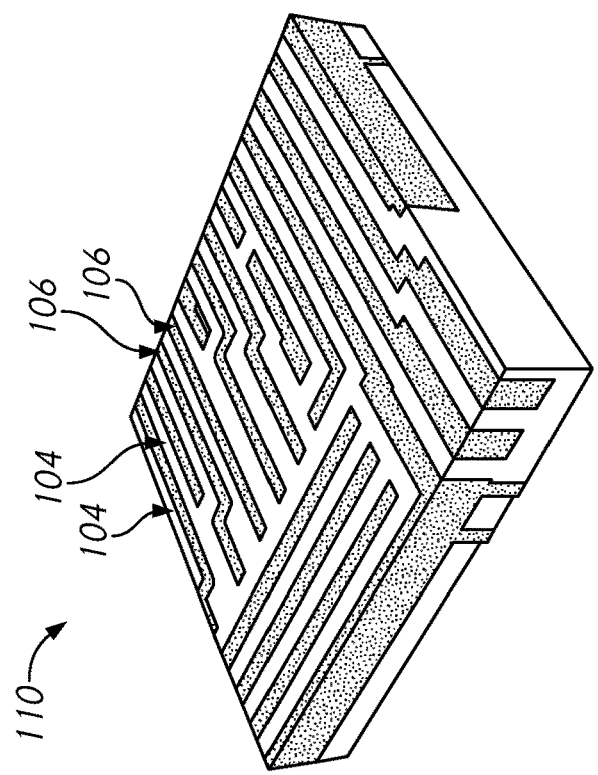
FIG. 1 is an illustration of portions of a damascene process which may be used in the fabrication of semiconductor devices according to an embodiment of the present disclosure.
Figure 1:
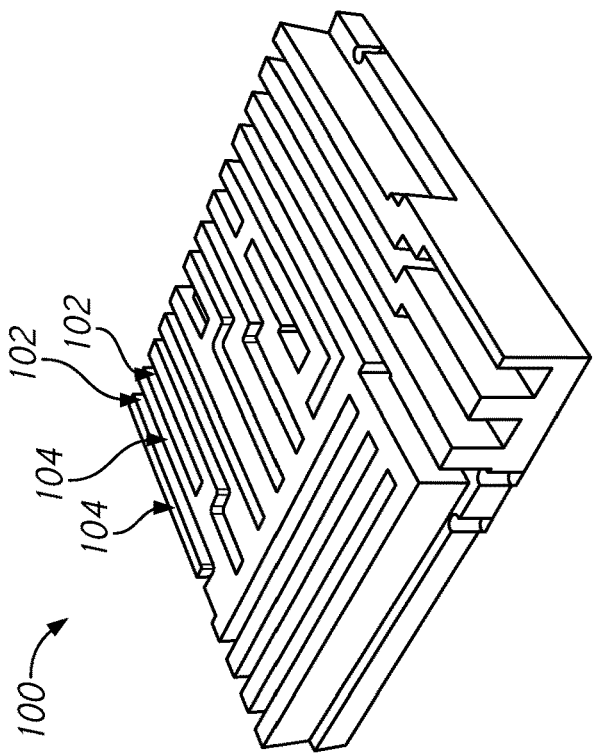

FIG. 1 is an illustration of portions of a damascene process which may be used in the fabrication of semiconductor devices according to an embodiment of the present disclosure. In a first step 100, trenches 102 are disposed in a dielectric material (e.g., an oxide). The dielectric material forms trench walls 104 between the trenches 102. In a second step 110, a conductive material is deposited in the trenches 102 to form conductive structures 106. In some examples, the conductive material may be a metallic material such as copper or tungsten or an alloy of multiple metallic materials.

As shown in step 100, when the trenches 102 are empty, the trench walls 104 are unsupported. In some instances, when adjacent trenches 102 extend for longer distances and/or the trenches 102 are closely spaced (e.g., the trench walls 104 are narrow), the trench walls 104 may be at risk of collapse. If a trench wall 104 collapses, when the metallic material is deposited in step 110, the conductive structures 106 meant to be formed in different trenches 102 may overlap, creating a short in a circuit including one or more of the conductive structures 106.

In some devices, the spacing between trenches 102 may be increased when conductive structures 106 extend for longer distances. That is, the trench walls 104 may be wider. While this may reduce the risk of trench walls 104 collapsing, it may also reduce the number of conductive structures 106 that can be included in the device. This may reduce the number of components that may be included in the device and/or require increasing the size of the device.

The present disclosure describes layouts of trench walls and conductive structures that may reduce the risk of trench wall collapse. Reducing the risk of trench wall collapsing may allow longer conductive structures to be formed and/or allow conductive structures to be more closely spaced.

Figure 2:
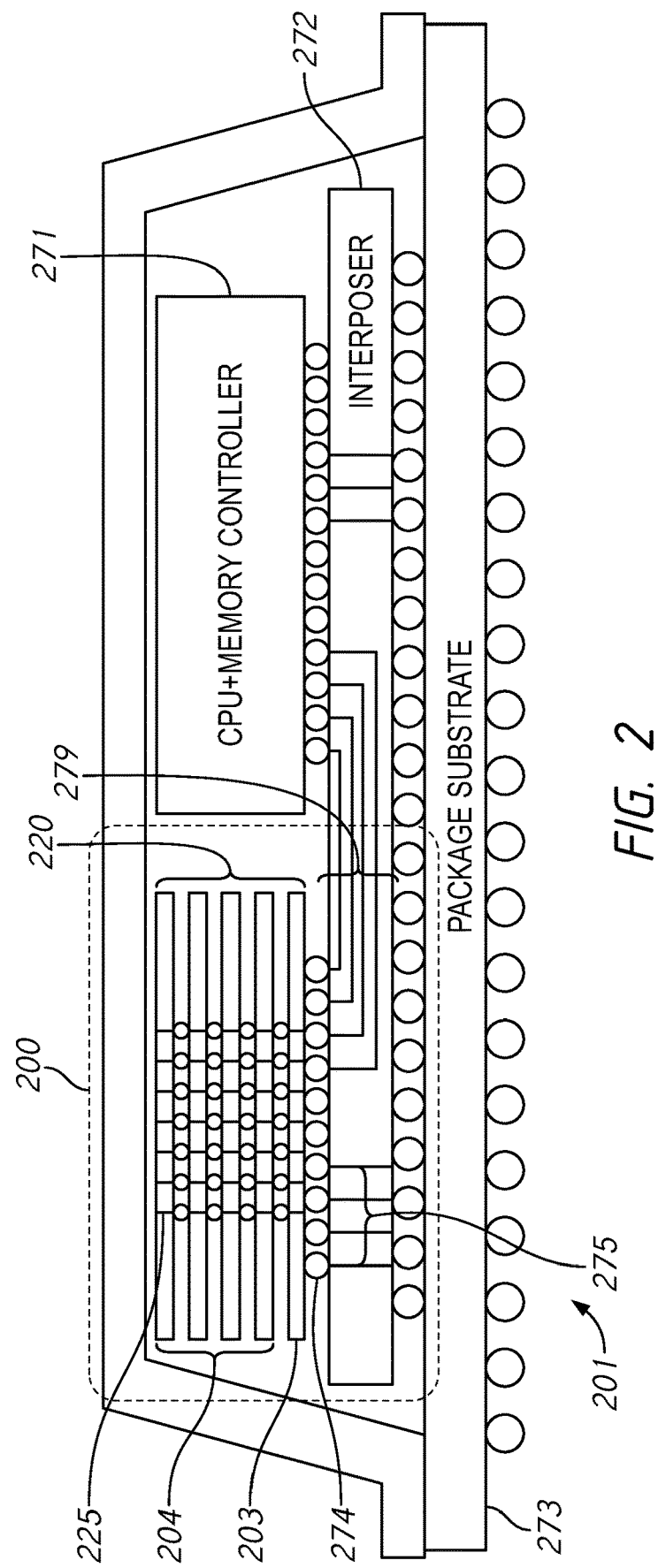
FIG. 2 is a schematic diagram of a semiconductor system including a semiconductor device that includes an interface chip and a plurality of core chips, in accordance with an embodiment of the present disclosure.

FIG. 2 is a schematic diagram of a semiconductor system including a semiconductor device that includes an interface chip and a plurality of core chips, in accordance with an embodiment of the present disclosure. For example, the semiconductor system 201 may include a semiconductor device 200, which may be a three-dimensional (3D) memory device, and a central processing unit (CPU) and memory controller 271, which may be a controller chip, on an interposer 272 on a package substrate 273. The interposer 272 may include one or more power lines 275 which supply power supply voltage from the package substrate 273. The interposer 272 includes a plurality of channels 279 that may interconnect the CPU and memory controller 271 and the semiconductor device 200.

The semiconductor device 200 may be a high bandwidth memory (HBM) in some embodiments. The semiconductor device 200 may include a plurality of chips (e.g., die) 220 including an interface (IF) chip 203 and core chips 204 stacked with each other. In this example, each core chip 204 may be a memory chip. Each of the core chips 204 may include a plurality of memory cells, which may be arranged in a memory array. The core chips 204 may further include circuitry for accessing the memory cells. In some examples, the memory cells may be DRAM memory cells. The IF chip 203 may include circuitry for accessing the memory cells on the core chips 204 for memory operations. For example, the IF chip 203 may include a command/address input circuit for receiving commands and addresses from the memory controller 271. In some examples, the IF chip 203 may include an internal clock generator for providing clock signals to the core chips 204 and/or other components of the IF chip 203. In some examples, the IF chip 203 may include an internal voltage generator that may receive power from power lines 275 and provide various voltages (e.g., VSS, VDD) to the core chips 204 and/or other components of the IF chip 203. In some examples, the various components of the core chips 204 and/or IF chip 203 may include and/or be coupled by one or more conductive structures according to principles of the present disclosure.

The semiconductor device 200 may include conductive vias TSVs 225 (e.g., through substrate electrodes) which couple the IF chip 203 and core chips 204 by penetrating the IF chip 203 and core chips 204. The IF chip 203 may be coupled to the interposer 272 via interconnects, such as bumps 274. For example, the bumps 274 may be microbumps having bump pitches of less than about or less than one hundred micro meters and exposed on an outside of the IF chip 203. A portion of the bumps 274 may be coupled to the one or more power lines 275. Another portion of the bumps 274 may be coupled to the plurality of channels 279.

While the examples provided herein relate to HBM, the principles of the present disclosure are not limit to this application. That is, conductive structures, trenches, and/or trench wall layouts as described herein may be provided in other memory types (e.g., DDR, LPDDR) and/or other semiconductor devices (e.g., memory controllers, CPUs).

Figure 3:
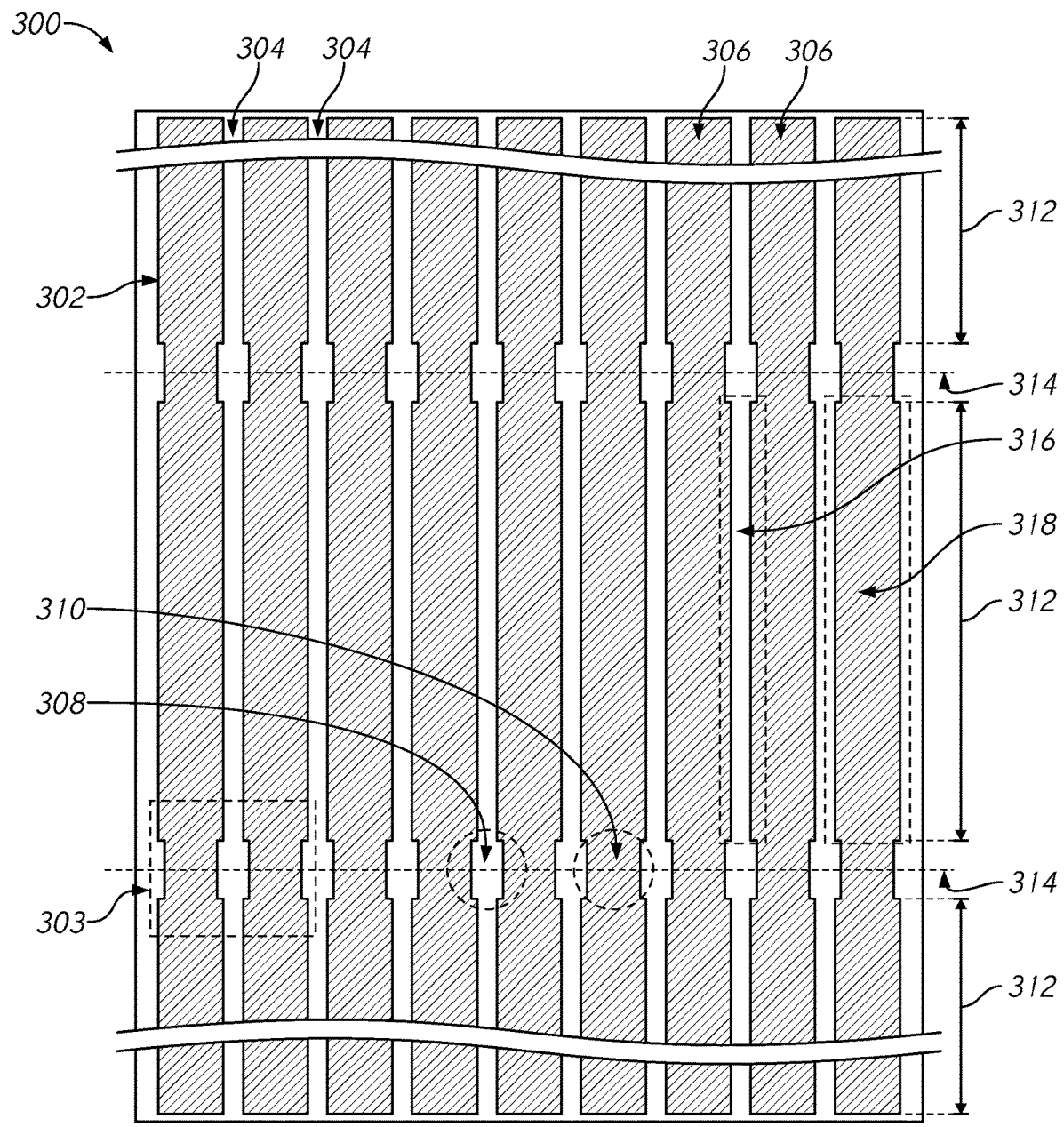
FIG. 3 is an illustration of a semiconductor device according to an embodiment of the disclosure.
Figure 3:
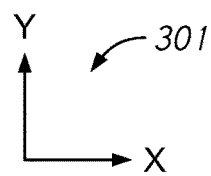

FIG. 3 is an illustration of a semiconductor device 300 according to an embodiment of the disclosure. The semiconductor device 300 may be included in semiconductor device 200 in some embodiments. The semiconductor device 300 may include trench walls 304 and conductive structures 306 disposed in trenches 302 between the trench walls 304. In some embodiments, the trench walls 304 may be formed of a dielectric material, such as an oxide, and the conductive structures 306 may be formed of a conductive material, such as a metallic material (e.g., copper, tungsten, alloy). In some embodiments, the conductive structures 306 may be included in a wiring layer/metallization layer (e.g., second metallization layer).

The trench walls 304 and conductive structures 306 may extend a length along a Y-dimension and spaced apart from one another in an X-dimension as indicated by the coordinate system 301. The trench walls 304 may be spaced apart such that trenches 302 (shown as filled with the conductive structures 306 in FIG. 3) are disposed between the trench walls 304. The trench walls 304 and conductive structures 306 may have lengths/distances in the Y-dimension and widths/thicknesses in the X-dimension. Note that FIG. 3 is not to scale as the dimensions of some features have been exaggerated to illustrate an example of the present disclosure. The X-dimension and Y-dimension may be perpendicular, and may be oriented in any manner.

As shown in FIG. 3, the trench walls 304 may include one or more "regular" portions 316. In some embodiments, the regular portions 316 of the trench walls 304 may correspond to "regular" portions 318 of the conductive structures 306. By regular portion, it is meant that the portion has a width that is consistent for a majority of a length of the trench wall 304 and/or conductive structure 306. The trench walls 304 may include one or more widened portions 308 in some embodiments. In the example shown in FIG. 3, the widened portions 308 are placed at an end of and/or between regular portions 316. In some embodiments, the widened portions 308 of the trench walls 304 may correspond to constricted portions 310 of the conductive structures 306. In some embodiments, such as the one shown in FIG. 3, the trench walls 304 and conductive structures 306 may include multiple widened portions 308 and/or constricted portions 310. In some embodiments, the widened portions 308 and/or constricted portions 310 may be spaced at regular intervals along the trench walls 304 and/or conductive structures 306. The widened portions 308 of the trench walls 304 may reduce the risk of collapse of the trench walls 304 in some embodiments, which may permit the conductive structures 306 to be spaced closer together and/or extend for greater distances in the semiconductor device 300 in some embodiments.

In some embodiments, a distance 312 (e.g., a length of the regular portions 316 and/or 318) between the widened portions 308 and/or constricted portions 310 may be based, at least in part, on a maximum distance defined by one or more design parameters. For example, in some embodiments, the width of the regular portions 316 and/or height of the trench wall 304 may determine, at least in part, how long a trench wall 304 may extend before a risk of collapse becomes too great for manufacturing tolerances. For example, in some embodiments, a distance 312 between two widened portions 308 may be based, at least in part, on a width of a regular portion 316. Other design parameters may also be used, for example, properties (e.g., stiffness) of the material(s) included in the trench wall 304. In other embodiments, the distance 312 may be less than a maximum distance defined by the one or more design parameters. While increasing the number of widened portions 308 and/or constricted portions 310 may reduce risk of collapse of the trench walls 304, an increase in constricted portions 310 may lead to an increase of resistance in the conductive structure 306. An increase in resistance may be undesirable in some applications. However, in other applications, increasing the number of constricted portions 310 by reducing distance 312 may be used to adjust the resistance of the conductive structures 306 to a desired value.

Although in the example shown in FIG. 3, all of the widened portions 308 and constricted portions 310 are aligned along lines 314 in the X-dimension, in other examples, some of the widened portions 308 and/or constricted portions 310 may be located at different locations along the Y-dimension. For example, differing placements of the widened portions 308 and/or constricted portions 310 may be desirable when the conductive structures 306 have differing starting and/or ending points within the device 300. In another example, some of the trench walls 304 may have differing widths, which may permit or require different intervals between widened portions 308. Furthermore, in some embodiments, some of the widened portions 308 and/or constricted portions 310 may have differing dimensions from the other widened portions 308 and/or constricted portions 310. Furthermore, while FIG. 3 illustrates the widened portions 308 of the trench walls 304 as centered along a longitudinal axis along which regular portions 316 are also centered, in some embodiments, the widened portions 308 may be offset to one side or the other of the regular portions 316. Similarly, the constricted portions 310 need not be centered relative to the regular portions 308 of the conductive structures 306. Furthermore, in some embodiments, every other trench wall 304 and conductive structure 306 may include a widened portion 308 and constricted portion 310, respectively, rather than every trench wall 304 and conductive structure 306 including a widened portion 308 and constricted portion 310, respectively.

Figure 4:
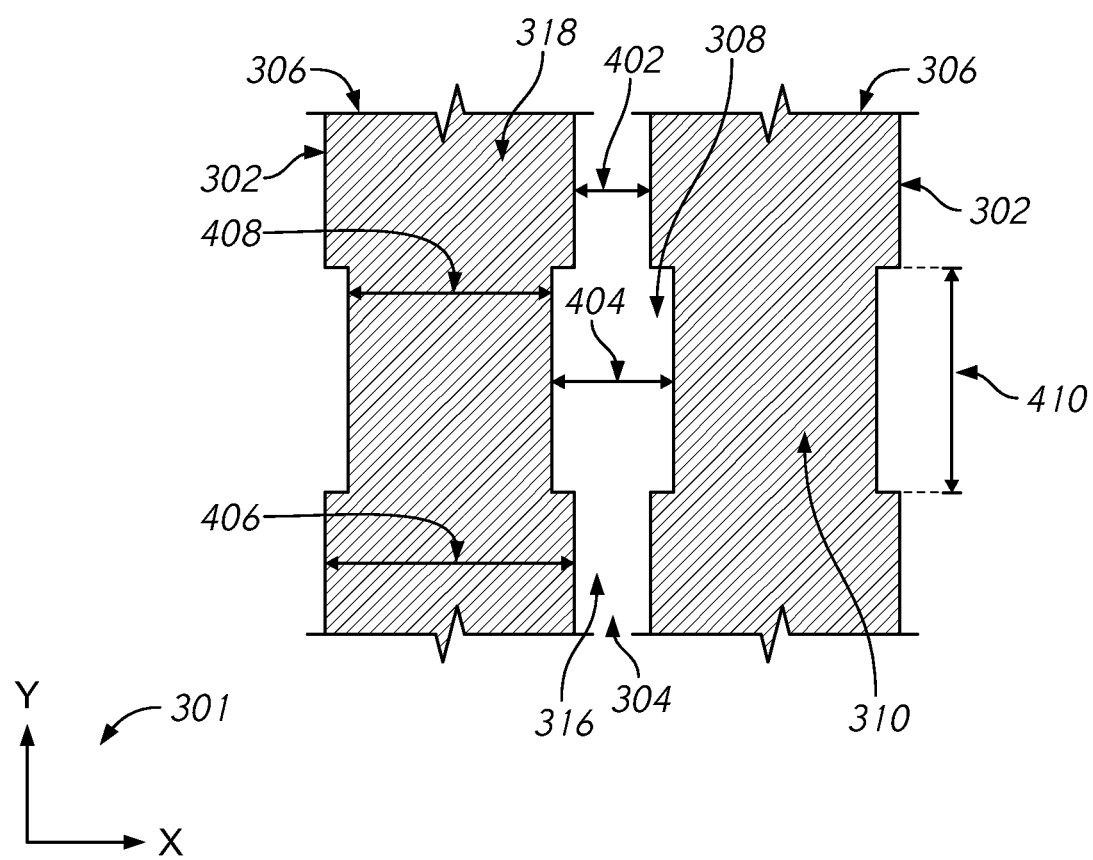
FIG. 4 is an enlarged view of a portion of the semiconductor device shown in FIG. 3.

FIG. 4 is an enlarged view of a portion of device 300 indicated by box 303 shown in FIG. 3. In FIG. 4, portions of two conductive structures 306 and a portion of a trench wall 304 is shown. FIG. 4 is not to scale as the dimensions of some features have been exaggerated to illustrate an example of the present disclosure.

As shown in FIG. 4, the trench wall 304 may have a width 402 at the regular portion 316 and a width 404 at the widened portion 308. Width 402 may be less than width 404. In some embodiments, width 402 may be a minimum spacing and/or desired spacing between conductive structures 306. In some embodiments of the disclosure the minimum spacing corresponds and/or is related to a minimum feature size of a semiconductor fabrication process. The conductive structures 306 may have a width 406 at the regular portion 318 and a width 408 at the constricted portions 310. Width 406 may be greater than width 408. In some embodiments, width 408 may be a minimum width that permits the conductive structure 306 to operate effectively. The width 408 and/or width 406 may be based, at least in part, on a purpose of the conductive structure 306 (e.g., high voltage line, low voltage signal line). As described herein, all widths are along the X-dimension.

The widened portions 308 and/or constricted portions 310 may extend for a distance 410 in the Y-dimension. In some examples, the width 408, width 404 and/or distance 410 may be based, at least in part, on a tradeoff between a desire to reduce trench wall collapse and increasing resistance of the conductive structure 306.

The widths of the conductive structures 306 and/or trench walls 304 and/or the distance 410 of the widened portions 308 and/or constricted portions 310 may have ranges of values that may result in reduced trench wall collapse. For example, the width 408 of the constricted portion 310 may vary between approximately 33-80% or less of the width 406 in some embodiments. Similarly, the width 404 of the widened portion 308 may vary between approximately 150-300% or greater of the width 402 in some embodiments. In some embodiments, the distance 410 may be based, at least in part, on the width 404 and/or the distance 312. For example, in some embodiments, the distance 410 may be approximately 0.05% or greater of the distance 312. In some examples, the width 408, width 404 and/or distance 410 may be based, at least in part, on properties of the material(s) from which the trench wall 304 is formed (e.g., stiffness, material, etc.).

Although the constricted portions 310 have been described with reference to the conductive structures 306, it should be understood that the features of the constricted portions 310 may also apply to the trenches 302 between the trench walls 304 at least because the conductive structures 306 are deposited conformably within the trenches 302.

Figure 5:
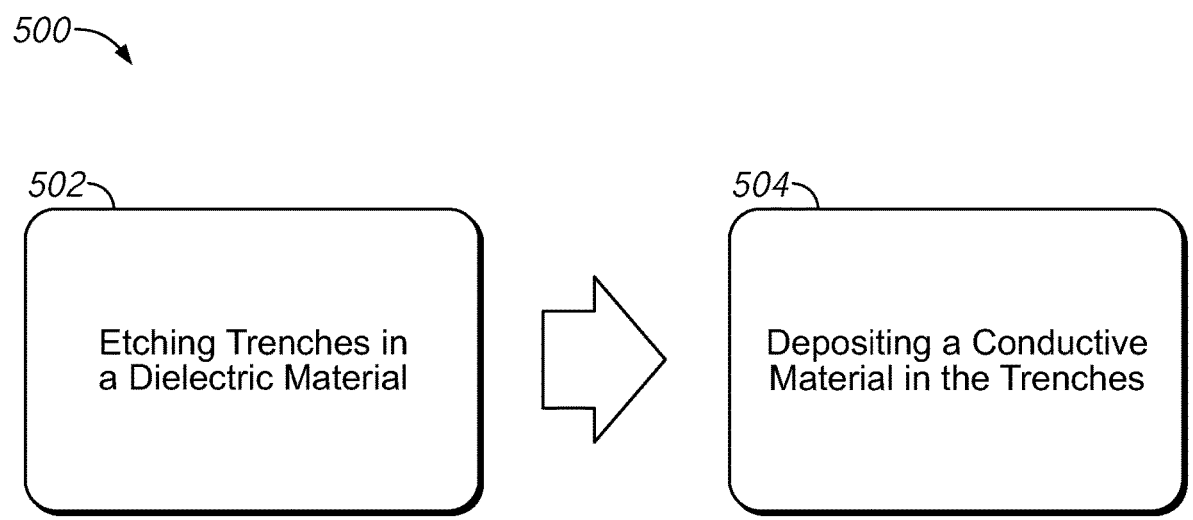
FIG. 5 is a flowchart of a method according to an embodiment of the disclosure.

FIG. 5 is a flow chart of a method 500 according to an embodiment of the disclosure. The method 500 may be used to form the trenches 302, trench walls 304, and/or conductive structures 306 in some embodiments. In some embodiments, the method 500 may be, or may be a portion of, a damascene process.

At block 502, a step of "etching trenches in a dielectric material" may be performed. The etching of the trenches (e.g., trenches 302) may form trench walls (e.g., trench walls 304) extending a distance in the Y-dimension between the trenches. The trench walls may have a width in the X-dimension equal to a spacing between the trenches in the X-dimension. As a result of the etching, at least one of the trench walls may include at least one widened portion (e.g., widened portion 308).

At block 504, a step of "depositing a conductive material in the trenches" may be performed. The deposition of the conductive material may form conductive structures (e.g., conductive structures 306) within the trenches. At least one of the conductive structures may include at least one constricted portion (e.g., constricted portion 310). In some embodiments, the constricted portion may be due to the widened portion of the trench wall.

As disclosed herein, trench walls with widened portions may be used to reduce risk of trench wall collapse in some embodiments. In some embodiments, conductive structures with constricted portions may be used, which may allow for widened portions of the trench walls to reduce the risk of trench wall collapse. Reducing the risk of trench wall collapse may permit closer spacing of conductive structures and/or increased length of conductive structures.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. An apparatus comprising:
   a trench wall extending a first length in a first dimension and having a first width in a second dimension, wherein the trench wall includes a first widened portion, wherein the first widened portion:
   extends a second length in the first dimension, wherein the second length is less than the first length; and
   has a second width in the second dimension, wherein the second width is greater than the first width.

2. The apparatus of claim 1, wherein the trench wall includes a dielectric material.

3. The apparatus of claim 1, wherein the trench wall includes a first end and a second end opposite the first end in the first dimension and the first widened portion is between the first end and the second end.

4. The apparatus of claim 1, wherein the trench wall further includes a second widened portion spaced a distance along the first dimension from the first widened portion.

5. The apparatus of claim 4, wherein the distance between the first widened portion and the second widened portion is based, at least in part, on the first width of the trench wall.

6. The apparatus of claim 4, wherein the distance between the first widened portion and the second widened portion is based, at least in part, on a property of a material included in the trench wall.

7. The apparatus of claim 1, further comprising a second trench wall extending a third length in the first dimension, wherein the second trench wall has a third width in the second dimension, wherein the second trench wall includes a second widened portion, wherein the trench wall and the second trench wall are spaced apart in the second dimension and a trench is between the trench wall and the second trench wall.

8. The apparatus of claim 7, wherein the trench filled with a conductive material.

9. The apparatus of claim 7, wherein the trench wall and the second trench wall each includes a first end and a second end opposite the first end in the first dimension and extend a same length in the first dimension,
wherein the first widened portion is positioned at a same distance from the first end of the trench wall as the second widened portion is positioned from the first end of the second trench wall.

10. The apparatus of claim 7, wherein the second widened portion has a width equal to the second width of the first widened portion and a length equal to the second length of the first widened portion.

11. An apparatus comprising:
a conductive structure extending a first length in a first dimension and having a first width in a second dimension, wherein the conductive structure includes a first constricted portion, wherein the first constricted portion:
extends a second length in the first dimension, wherein the second length is less than the first length; and
has a second width in the second dimension, wherein the second width is less than the first width; wherein the conductive structure is in a trench formed in a dielectric material.

12. The apparatus of claim 11, wherein the conductive structure includes a metallic material.

13. The apparatus of claim 12, wherein the metallic material includes at least one of copper or tungsten.

14. The apparatus of claim 11, wherein the conductive structure includes a first end and a second end opposite the first end in the first dimension and the first constricted portion is located between the first end and the second end.

15. The apparatus of claim 11, wherein the conductive structure further includes a second constricted portion spaced a distance along the first dimension from the first constricted portion.

16. The apparatus of claim 15, wherein the second constricted portion has a width equal to the second width of the first constricted portion and a length equal to the second length of the first constricted portion.

17. The apparatus of claim 11, further comprising a second conductive structure extending a third length in the first dimension, wherein the second conductive structure has a third width in the second dimension, wherein the second conductive structure includes a second constricted portion, wherein the conductive structure and the second conductive structure are spaced apart in the second dimension and a trench wall is between the conductive structure and the second conductive structure.

18. A method, comprising:
etching a plurality of trenches in a dielectric material to form a plurality of trench walls extending in a first dimension between individual ones of the plurality of trenches, wherein the plurality of trench walls have a first width equal to a spacing between the plurality of trenches in a second dimension, wherein at least one of the plurality of trench walls includes:
a first length in the first dimension; and
a widened portion, wherein the widened portion extends a second length in the first dimension and has a second width in the second dimension, wherein the second length is less than the first length and the second width is greater than the first width.

19. The method of claim 18, further comprising depositing a conductive material in the plurality of trenches to form a plurality of conductive structures, wherein at least one of the plurality of conductive structures includes a constricted portion.

* * * * *